United States Patent
Kang (10) Patent No.: US 8,771,806 B2
(45) Date of Patent: Jul. 8, 2014

(54) SURFACE COATING METHOD FOR HYDROPHOBIC AND SUPERHYDROPHOBIC TREATMENT IN ATMOSPHERIC PRESSURE PLASMA

(76) Inventor: Bang-Kwon Kang, Gyeonggi-Do (KR)

( * ) Notice: Subject to any disclaimer, the term of this patent is extended or adjusted under 35 U.S.C. 154(b) by 1568 days.

(21) Appl. No.: 11/988,442
(22) PCT Filed: Jul. 7, 2006
(86) PCT No.: PCT/KR2006/002670
§ 371 (c)(1),
(2), (4) Date: Jan. 8, 2008
(87) PCT Pub. No.: WO2007/007995
PCT Pub. Date: Jan. 18, 2007

(65) Prior Publication Data
US 2010/0221452 A1 Sep. 2, 2010

(30) Foreign Application Priority Data
Jul. 9, 2005 (KR) .................... 10-2005-0061970

(51) Int. Cl.
C23C 16/50 (2006.01)
C23C 16/22 (2006.01)
(52) U.S. Cl.
CPC .............. *C23C 16/50* (2013.01); *C23C 16/22* (2013.01)
USPC .......................................... 427/577; 427/569
(58) Field of Classification Search
USPC ................................................ 427/577, 569
See application file for complete search history.

(56) References Cited

U.S. PATENT DOCUMENTS 4,869,922 A 9/1989 D'Agostino et al.
5,733,610 A 3/1998 Okazaki et al.
(Continued)

FOREIGN PATENT DOCUMENTS

JP 6-285365 A 10/1994
JP 08024560 A * 1/1996
(Continued)

OTHER PUBLICATIONS

PCT/KR2006/002670 International Search Report.

*Primary Examiner* — Jie Yang
(74) *Attorney, Agent, or Firm* — Lowe Hauptman & Ham, LLP (57) ABSTRACT

The present invention relates to a method of coating fluorocarbon or hydrocarbon on the surface of a workpiece using atmospheric pressure plasma. More particularly, the present invention relates to a method of coating hydrocarbon or fluorocarbon on the surface of a workpiece using plasma generated under atmospheric pressure such that the workpiece can have a hydrophobic or super-hydrophobic surface.

The method of coating a surface of a workpiece with fluorocarbon to be hydrophobic or super-hydrophobic according to the present invention comprises the steps of generating first atmospheric pressure glow plasma by supplying a reaction gas into a discharge space formed between a first electrode and a second electrode, the reaction gas containing hydrogen gas, fluorocarbon gas and inert gas, the first and second electrodes being connected to an RF power supply of an atmospheric pressure plasma generator; and approaching the workpiece to the first electrode downstream of a reaction gas flow passing through the discharge space, such that the plasma created in the discharge space is transferred into a space between the first electrode and the workpiece to generate a second atmospheric pressure glow plasma therein, whereby a fluorocarbon coating layer can be formed on the surface of the workpiece.

5 Claims, 7 Drawing Sheets
(4 of 7 Drawing Sheet(s) Filed in Color)

(56) References Cited

U.S. PATENT DOCUMENTS 6,649,222 B1 11/2003 D'Agostino et al.
7,887,889 B2 * 2/2011 David et al. ................... 427/490
2002/0097295 A1 7/2002 Toda et al.

FOREIGN PATENT DOCUMENTS

| JP | 9-208726 A | 8/1997 |
| KR | 2004-0095104 A | 11/2004 |

* cited by examiner

SURFACE COATING METHOD FOR HYDROPHOBIC AND SUPERHYDROPHOBIC TREATMENT IN ATMOSPHERIC PRESSURE PLASMA

RELATED APPLICATIONS

The present application is based on, and claims priority from International Application PCT/KR2006/002670, filed Jul. 7, 2006, which claims priority from Korean Application No. 10-2005-0061970, filed Jul. 9, 2005.

TECHNICAL FIELD

The present invention relates to a method of coating fluorocarbon or hydrocarbon on the surface of a workpiece using atmospheric pressure plasma. More particularly, the present invention relates to a method of coating hydrocarbon or fluorocarbon on the surface of a workpiece using plasma generated under atmospheric pressure such that the workpiece can have a hydrophobic or super-hydrophobic surface.

BACKGROUND ART

Hydrophobicity denotes a chemical property representing interaction between water and an object, i.e. conceptually having no affinity to water.

Figure 13:
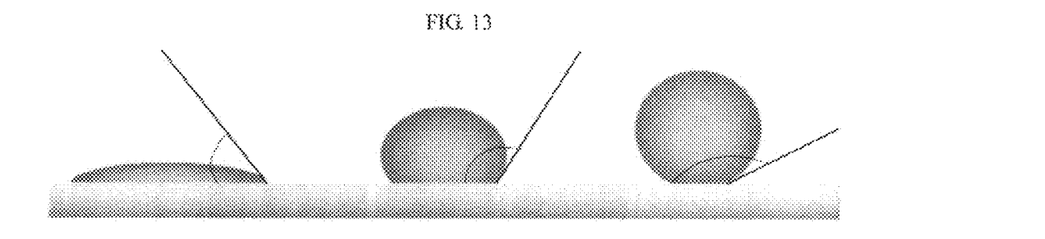
FIG. 13 shows examples of contact angles between water and the surface of an object.

FIG. 13 shows a contact angle between water and the surface of an object. A higher contact angle represents higher hydrophobic tendency. For example, a contact angle of 180 degrees means that the object surface is treated to be superhydrophobic. In this case, the water remains in the form of a perfect sphere on the object surface.

Figure 14:
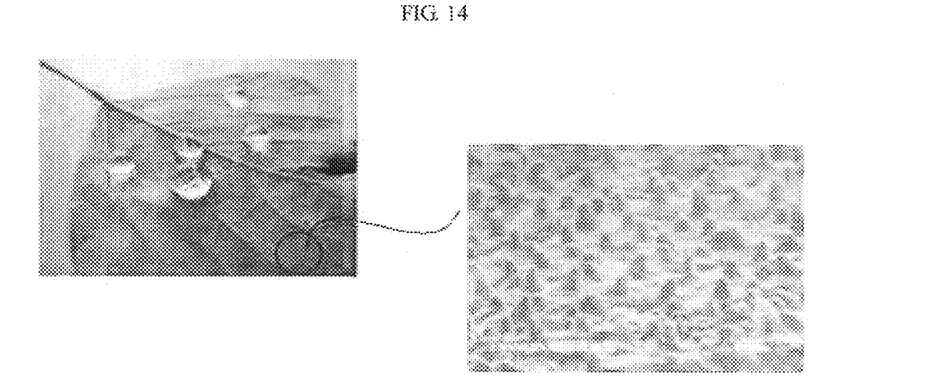
FIG. 14 shows a plant leaf with hydrophobicity and its porous structure.

In general, hydrophobic materials are easily found in nature. Taro leaves or lotus leaves are typical hydrophobic materials. It has been found out by Wenzel's and Cassie's that the hydrophobicity on the leaves' surface is due to microporous structures on the surface. FIG. 14 shows a plant leaf having hydrophobicity and its porous structure.

A chemical or physical process may be used for treating the surface of an object to be hydrophobic or super-hydrophobic.

Figure 15:
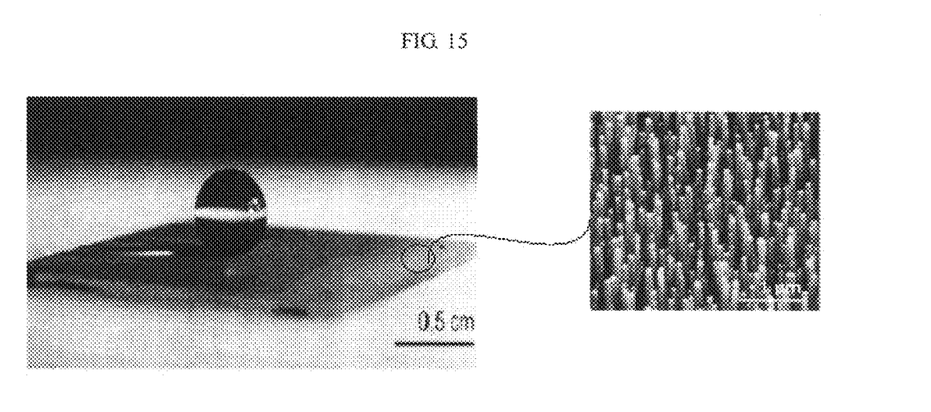
FIG. 15 shows an example of the hydrophobic surface structure of an object treated using carbon nano-tubes.

FIG. 15 shows an example of the surface structure of an object modified through a physical process. In order to provide super-hydrophobicity, carbon nano-tubes are used to form a porous structure on a smooth surface of the object. If a water drop is fallen onto the surface of the carbon nanotubes, it remains in a nearly spherical form.

The chemical process involves applying fluoric coating and the like on the surface of an object, e.g. when manufacturing a fry pan. That is, the chemical composition of an object surface is changed to allow the surface to be hydrophobic or super-hydrophobic. Fluorocarbon polymers exhibit a strong hydrophobic tendency, in particular, among other chemical materials.

U.S. Pat. Nos. 4,869,922, 6,649,222 and 5,733,610 disclose chemical processes of treating the surface of an object to be hydrophobic or super-hydrophobic.

U.S. Pat. No. 4,869,922 discloses a surface treating process of coating polyfluorocarbon on the surface of an object using vacuum plasma to exhibit hydrophobicity. In this patent, a mixture of hydrogen gas and monomer C-F gas is injected into a discharge space under a pressure of 1 Torr. In addition, a 27.12 MHz RF (radio frequency) power of 40 to 80 W is applied for 5 to 20 minutes to coat polyfluorocarbon on the surface of an aluminum specimen with a size of 20×20×1 mm, so that the specimen surface can be modified to be hydrophobic.

The U.S. Pat. No. 6,649,222 discloses a process of treating the surface of a specimen to be super-hydrophobic using modulated glow discharge plasma. A 13.56 MHz modulated frequency power of 50 to 75 W is applied for 20 to 90 minutes under a pressure of 300 to 400 mTorr, and a monomer C-F gas is used to treat the surface of a non-metallic specimen, such as PE, PP, silicon, glass and PET, with an area of 2 to 20 $cm^2$.

U.S. Pat. No. 5,733,610 discloses a surface treatment process of providing hydrophobicity under atmospheric pressure. A frequency of 3000 Hz is used to treat the surface of organic and silicon wafer specimen under atmospheric pressure.

The conventional techniques using a vacuum system for treating the surface to be hydrophobic or super-hydrophobic are carried out only in a closed system. Thus, the conventional techniques cannot implement a continuous or automated process in which the specimen is moved and simultaneously treated, and thus, there is a problem in that the techniques cannot be applied to mass-production industries.

Further, expensive vacuum equipment for use in a vacuum system and its relevant maintenance lead to significant cost increases.

In addition, since polymers change their properties at high temperature, they should be processed at lower temperatures within a few seconds. Thus, there is another problem in that it is difficult to control process conditions for fine treatment.

Furthermore, there is a further problem in that a process of treating the surface of an object to be hydrophobic under atmospheric pressure should employ a batch system to suppress arc generation.

DISCLOSURE OF INVENTION

Technical Problem

The present invention has been conceived to solve the aforementioned problems in the conventional method of treating the surface of an object to be hydrophobic or super-hydrophobic. An object of the present invention is to provide a method of treating the surface of an object to be hydrophobic or super-hydrophobic under atmospheric pressure without using a vacuum system.

Another object of the invention is to provide a method of treating the surface of an object under atmospheric pressure without using a bath system.

Technical Solution

According to an aspect of the present invention, there is provided a method of coating a surface of a workpiece with fluorocarbon to be hydrophobic or super-hydrophobic, which comprises the steps of generating first atmospheric pressure glow plasma by supplying a reaction gas into a discharge space formed between a first electrode and a second electrode, the reaction gas containing hydrogen gas, fluorocarbon gas and inert gas, the first and second electrodes being connected to an RF power supply of an atmospheric pressure plasma generator; and approaching the workpiece to the first electrode downstream of a reaction gas flow passing through the discharge space, such that the plasma created in the discharge space is transferred into a space between the first electrode and the workpiece to generate a second atmospheric pressure glow plasma therein, whereby a fluorocarbon coating layer can be formed on the surface of the workpiece. Preferably, the fluorocarbon gas is selected from the group consisting of $CF_3$, $CF_4$, $C_2F_6$, $C_4F_8$ and a mixture thereof, and a volume ratio of the fluorocarbon gas and hydrogen gas contained in the reaction gas (fluorocarbon/hydrogen) is within a range of 0.1 to 10. Preferably, a volume of the inert gas contained in the reaction gas is at least 90% of a total volume of the reaction gas, the inert gas includes helium gas, and a volume of the helium gas is at least 60% of a total volume of the inert gas. More preferably, an RF power supply operating at a frequency of 100 KHz to 60 MHz is employed to generate the plasma, and the workpiece approaches the first electrode within a range of 1 to 10 mm.

In the surface coating method of the present invention, the first electrode of the plasma generator takes the shape of a rod with a predetermined length; the second electrode is spaced apart from the first electrode by a predetermined distance along a longitudinal direction of the first electrode to thereby form a discharge space between the electrodes; the plasma generator further includes a gas supply unit formed with a passage through which the reaction gas can be supplied to the discharge space; and the passage includes a buffer space formed along a longitudinal direction of the first electrode, a mixing space formed along the longitudinal direction of the first electrode and having one side opened toward the discharge space, and an orifice for allowing the buffer space and an inner wall of the mixing space to communicate with each other. In such a case, the plasma generator may further include a capacitor connected to the first electrode.

Alternatively, in the surface coating method of the present invention, the first electrode of the plasma generator takes the shape of a rod with a predetermined length; the second electrode is spaced apart from the first electrode by a predetermined distance along a longitudinal direction of the first electrode to thereby form a discharge space between the electrodes; and the plasma generator further includes a gas supply unit formed with a passage through which the reaction gas can be supplied to the discharge space, and a capacitor connected to the first electrode.

According to another aspect of the present invention, there is provided a method of coating a surface of a workpiece with fluorocarbon to be hydrophobic or super-hydrophobic, which comprises the steps of generating first atmospheric pressure glow plasma by supplying a reaction gas into a discharge space formed between a first electrode and a second electrode, the reaction gas containing hydrocarbon gas, fluorocarbon gas and inert gas, the first and second electrodes being connected to an RF power supply of an atmospheric pressure plasma generator; and approaching the workpiece to the first electrode downstream of a reaction gas flow passing through the discharge space, such that the plasma created in the discharge space is transferred into a space between the first electrode and the workpiece to generate a second atmospheric pressure glow plasma therein, whereby a fluorocarbon coating layer can be formed on the surface of the workpiece. In such a case, it is preferred that the hydrocarbon gas be selected from the group consisting of $C_2H_2$, $CH_4$, $C_2H_4$, $C_2H_6$, $C_3H_8$ and a mixture thereof, and the fluorocarbon gas also be selected from the group consisting of $CF_3$, $CF_4$, $C_2F_6$, $C_4F_8$ and a mixture thereof. Further, it is preferred that a volume ratio of the fluorocarbon gas and hydrocarbon gas contained in the reaction gas (fluorocarbon/hydrocarbon) be within a range of 0.1 to 10 and a volume of the inert gas contained in the reaction gas be at least 90% of a total volume of the reaction gas. Preferably, the inert gas includes helium gas, and a volume of the helium gas is at least 60% of a total volume of the inert gas.

An RF power supply operating at a frequency of 100 KHz to 60 MHz may be employed to generate the plasma. Preferably, the workpiece approaches the first electrode within a range of 1 to 10 mm.

According to a further aspect of the present invention, there is provided a method of coating a surface of a workpiece with fluorocarbon to be hydrophobic or super-hydrophobic, which comprises the steps of generating an atmospheric pressure glow plasma by supplying an atmospheric pressure plasma generator with a reaction gas containing hydrogen gas, fluorocarbon gas and inert gas; and exposing the workpiece surface to the generated atmospheric pressure glow plasma to thereby form a fluorocarbon coating layer on the workpiece surface. Preferably, the fluorocarbon gas is selected from the group consisting of $CF_3$, $CF_4$, $C_2F_6$, $C_4F_8$ and a mixture thereof and a volume ratio of the fluorocarbon gas and hydrogen gas contained in the reaction gas (fluorocarbon/hydrogen) is within a range of 0.1 to 10. Preferably, a volume of the inert gas contained in the reaction gas is at least 90% of a total volume of the reaction gas, the inert gas includes helium gas, and a volume of the helium gas is at least 60% of a total volume of the inert gas. Further, in the glow plasma generating step, the atmospheric pressure plasma generator may use an RF power supply operating at a frequency of 100 KHz to 60 MHz.

According to a still further aspect of the present invention, there is provided a method of coating a surface of a workpiece with fluorocarbon to be hydrophobic or super-hydrophobic, which comprises the steps of generating an atmospheric pressure glow plasma by supplying an atmospheric pressure plasma generator with a reaction gas containing hydrocarbon gas, fluorocarbon gas and inert gas; and exposing the workpiece surface to the generated atmospheric pressure glow plasma to thereby form a fluorocarbon coating layer on the workpiece surface. Preferably, the fluorocarbon gas is selected from the group consisting of $CF_3$, $CF_4$, $C_2F_6$, $C_4F_8$ and a mixture thereof, and the hydrocarbon gas is selected from the group consisting of $C_2H_2$, $CH_4$, $C_2H_4$, $C_2H_6$, $C_3H_8$ and a mixture thereof. Preferably, a volume ratio of the fluorocarbon gas and hydrocarbon gas contained in the reaction gas (fluorocarbon/hydrocarbon) is within a range of 0.1 to 10, a volume of the inert gas contained in the reaction gas is at least 90% of a total volume of the reaction gas, the inert gas includes helium gas, and a volume of the helium gas is at least 60% of a total volume of the inert gas. An RF power supply operating at a frequency of 100 KHz to 60 MHz may be employed to generate the plasma.

According to a still further aspect of the present invention, there is provided a method of coating a surface of a workpiece with hydrocarbon, comprising the steps of generating first atmospheric pressure glow plasma by supplying a reaction gas into a discharge space formed between a first electrode and a second electrode, the reaction gas containing hydrocarbon gas and inert gas, the first and second electrodes being connected to an RF power supply of an atmospheric pressure plasma generator; and approaching the workpiece to the first electrode downstream of a reaction gas flow passing through the discharge space, such that the plasma created in the discharge space is transferred into a space between the first electrode and the workpiece to generate a second atmospheric pressure glow plasma therein, whereby a hydrocarbon coating layer can be formed on the surface of the workpiece. Preferably, the hydrocarbon gas is selected from the group consisting of $C_2H_2$, $CH_4$, $C_2H_4$, $C_2H_6$, $C_3H_8$ and a mixture thereof, and a volume of the inert gas is at least 90% of a total volume of the reaction gas. More preferably, a volume of gas selected from the group consisting of helium, argon and the mixture thereof is at least 60% of a total volume of the inert gas.

In the surface coating method of the present invention, the first electrode of the plasma generator takes the shape of a rod with a predetermined length; the second electrode is spaced apart from the first electrode by a predetermined distance along a longitudinal direction of the first electrode to thereby form a discharge space between the electrodes; the plasma generator further includes a gas supply unit formed with a passage through which the reaction gas can be supplied to the discharge space; and the passage includes a buffer space formed along a longitudinal direction of the first electrode, a mixing space formed along the longitudinal direction of the first electrode and having one side opened toward the discharge space, and an orifice for allowing the buffer space and an inner wall of the mixing space to communicate with each other. 40. The plasma generator may further include a capacitor connected to the first electrode.

Alternatively, in the surface coating method of the present invention, the first electrode of the plasma generator takes the shape of a rod with a predetermined length; the second electrode is spaced apart from the first electrode by a predetermined distance along a longitudinal direction of the first electrode to thereby form a discharge space between the electrodes; and the plasma generator further includes a gas supply unit formed with a passage through which the reaction gas can be supplied to the discharge space, and a capacitor connected to the first electrode.

BRIEF DESCRIPTION OF DRAWINGS

The patent or application file contains at least one drawing executed in color. Copies of this patent or patent application publication with color drawing(s) will be provided by the Office upon request and payment of the necessary fee.

BEST MODE FOR CARRYING OUT THE INVENTION

Hereinafter, a method of treating the surface of a workpiece to be hydrophobic or super-hydrophobic according to preferred embodiments of the present invention will be described in detail with reference to the accompanying drawings.

Figure 1:
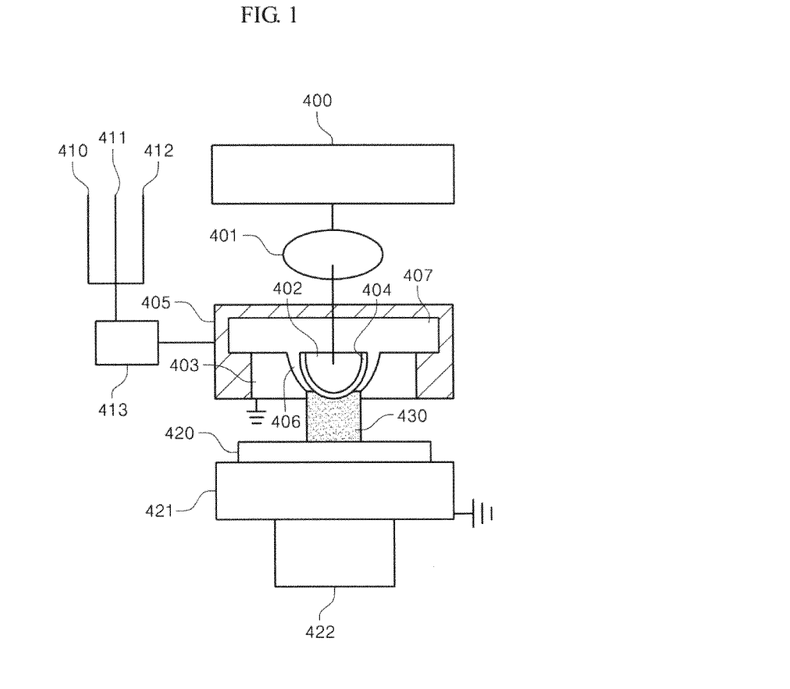
FIG. 1 is a schematic view of an atmospheric pressure plasma generator according to a first embodiment of the present invention.

FIG. 1 illustrates the configuration of an atmospheric pressure plasma generator for treating the surface of a workpiece to be hydrophobic or super-hydrophobic according to the present invention.

The atmospheric pressure generator comprises an RF power supply 400, a plasma module 405, a matching box 401, a specimen supply unit 421 and a gas supply unit.

The RF power supply 400 provides electrical energy required for ionizing a reaction gas into a plasma state, and the matching box 401 supplies the electrical energy received from the RF power supply 400 to the plasma module 405 in the form of electrical energy at a stable frequency band.

The gas supply unit includes gas supply tubes 410, 411 and 412 and a gas mixer 413. The gas supply tubes 410, 411 and 412 supply gas required for generating plasma and treating the surface of a workpiece to be hydrophobic or super-hydrophobic.

Alternatively, the gas supply tubes may comprise a plurality of tubes. The gas mixer 413 causes gas introduced through the gas supply tubes 410, 411 and 412 to be mixed into a reaction gas, which in turn is supplied to the plasma module 405.

The plasma module 405 includes a first electrode 402, a second electrode 403, a dielectric 404, a gas supply passage 407 and a discharge space 406.

The first electrode 402 is connected with the matching box 401 for receiving electrical energy from the RF power supply 400 and covered with the dielectric 404. The second electrode 403 is grounded and spaced apart from the first electrode 402 by a certain distance to form the discharge space 406 between the electrodes. The gas supply passage 407 accommodates reaction gas supplied from the gas mixer 413 and supplies the reaction gas to the discharge space 406. After the reaction gas is introduced into the discharge space 406 and electrical energy is then supplied to the first electrode 402, the reaction gas is glow-discharged in the discharge space 406 by means of a voltage between the first and second electrodes 402 and 403 and instantaneously converted into a plasma state.

The specimen supply unit 421 supplies a workpiece 420, which will be surface-treated, underneath the first electrode 402. The reaction gas in a plasma state, which is generated in the discharge space 406, flows under the first electrode 402. At this time, if the workpiece 420 is placed under the first electrode 402 at an outlet side of the discharge space 406, a plasma transition phenomenon occurs above the surface of the workpiece 420.

A method for providing the workpiece 420 includes a scan method, a roll-to-roll method, reel-to-reel method, and so on.

Figure 2:
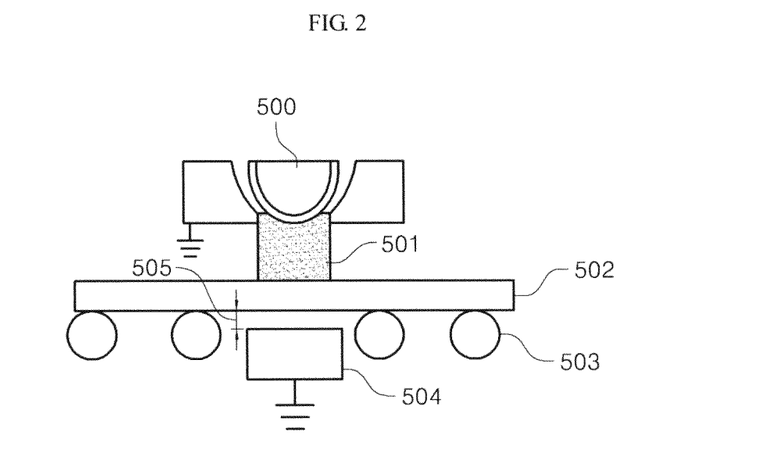
FIG. 2 is a conceptual view illustrating a roll-to-roll type specimen supply unit in the atmospheric pressure plasma generator of the present invention.

FIG. 2 shows a process of supplying a workpiece 502 below a first electrode 500 by means of a roll-to-roll method. The workpiece 502 is carried by a roller 503 and exposed directly to plasma transferred between the first electrode 500 and a ground electrode 504 such that it can be treated to be hydrophobic or super-hydrophobic. At this time, a distance between the electrode and the workpiece is about 1~10 mm.

The ground electrode 504 is disposed at a position slightly lower than the roller, and thus, a gap 505 is created between the workpiece and the ground electrode 504. Accordingly, the workpiece can be smoothly carried in such a state where a bottom surface of the workpiece is not brought into contact with the ground electrode 504.

Figure 3:
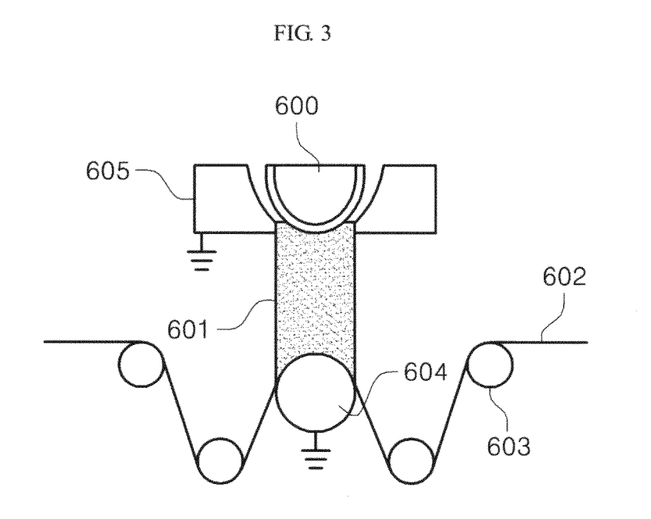
FIG. 3 is a conceptual view illustrating a reel-to-reel type specimen supply unit in the atmospheric pressure plasma generator of the present invention.

FIG. 3 shows a process of supplying a workpiece 602 below a first electrode 600 by means of a reel-to-reel method. The workpiece 602 is carried by a roller 603 and directly exposed to plasma 601 transferred between the first electrode 600 and a ground electrode 604 such that it can be treated to be hydrophobic or super-hydrophobic.

The RF power supply has an operating frequency of 100 KHz to 60 MHz and applies an RF power at a stable frequency band to electrodes by means of the matching box 401. The first electrode is covered with the dielectric 404, and thus, no arc is created and the damage of workpiece can be prevented.

A reaction gas used for treating the surface of a workpiece to be hydrophobic and super-hydrophobic is composed of inert gas and working gas. The inert gas is preferably helium and may further include argon, neon or the like. The inert gas preferably has a volume no less than 90%, and more preferably 95.00 to 99.99%, of the total volume of the reaction gas. Furthermore, at least 60% of the volume of the inert gas is preferably filled with helium.

In order to treat the workpiece surface to be hydrophobic or super-hydrophobic (e.g., to a degree that a contact angle is no less than)150°, hydrocarbon gas and fluorocarbon gas are used as the working gas. Preferably, the hydrocarbon gas is selected from the group consisting of $C_2H_2$, $CH_4$, $C_2H_4$, $C_2H_6$, $C_3H_8$ and a mixture thereof, and the fluorocarbon gas is selected from the group consisting of $CF_3$, $CF_4$, $C_2F_6$, $C_4F_8$ and a mixture thereof. As the working gas, hydrogen gas or $SiH_4$ gas may be used instead of hydrocarbon gas and $SF_6$ gas may also be used instead of fluorocarbon gas.

In addition, the volume of the fluorocarbon gas is preferably controlled to 0.1 to 10 times of the volume of the hydrogen gas or hydrocarbon gas. When the workpiece surface is exposed to the reaction gas in a plasma state, the fluorocarbon is coated on the workpiece surface in the form of polyfluorocarbon such that the workpiece exhibits hydrophobicity or super-hydrophobicity. At this time, hydrocarbon-based gas makes up a coating environment.

Other working gas for treating the workpiece surface to be hydrophobic includes hydrocarbon gas. When the surface of the workpiece is exposed to the reaction gas in a plasma state, the hydrocarbon is coated on the surface of the workpiece such that the workpiece exhibits hydrophobicity.

When plasma 430 is created in the discharge space 406, the workpiece 420 is carried and transferred below the first electrode 402 by means of the specimen supply unit 421 and the plasma is transferred and exposed directly to the workpiece 420. According to the reaction gas used, the workpiece 420 may be treated to be either hydrophobic or super-hydrophobic. The workpiece 420 may be treated at a standstill state or treated repeatedly. In general, in a case where a workpiece is smaller than the plasma generating area, the workpiece may be plasma-treated at a standstill state or repeatedly.

Figure 4:
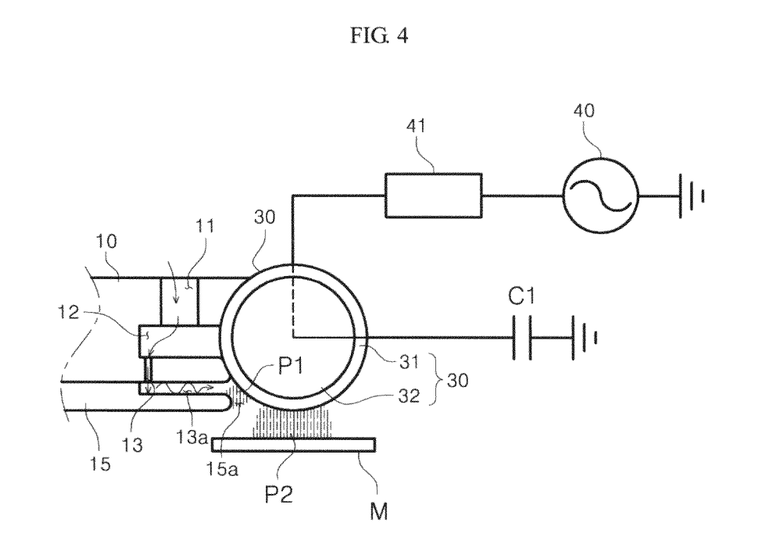
FIG. 4 is a schematic view of an atmospheric pressure plasma generator according to a second embodiment of the present invention.

FIG. 4 shows a plasma generator according to another embodiment of the invention. In the atmospheric pressure plasma generator of this embodiment, a first electrode assembly 30 is electrically connected to a high-frequency power supply 40 for supplying high-frequency power through a matching box 41. A second electrode 15 is spaced apart from the first electrode assembly 30 by a predetermined distance to form a discharge space 15a between the electrodes. A gas supply unit 10 formed with an inlet 11 through which a reaction gas is supplied into the discharge space 15a between the first electrode assembly 30 and the second electrode 15 is configured to hold and support the first electrode assembly 30 and the second electrode 15. A work piece M is disposed downstream of the reaction gas flow passing through the discharge space 15a and spaced apart from the first electrode assembly 30 by a predetermined distance. The inlet 11 of the gas supply unit 10 is configured to communicate with a buffer space 12 which is formed in a longitudinal direction of the first electrode assembly 30. Further, the gas supply unit 10 is formed with a mixing space 13a which is formed along the longitudinal direction of the first electrode assembly 30, spaced apart from the buffer space 12 by a certain distance and connected with the discharge space 15a. In addition, the gas supply unit 10 is provided with a plurality of orifices 13 which are formed to communicate the mixing space 13a and the buffer space 12 with each other. Furthermore, the first electrode assembly 30 is a long member of which one side (indicated by a dot line in this figure) is connected to a power supply and another side is electrically connected and grounded to a capacitor. The first electrode assembly 30 includes a conductor 32 and a silicon resin 31 wrapping around an outer circumferential surface of the conductor 32.

If an RF power is applied to the first electrode assembly 30 while supplying a reaction gas through the inlet 11 of the gas supply unit 10, first plasma P1 is first generated in the discharge space 15a. Since the distance between the first electrode assembly and the second electrode is smaller than the distance between the first electrode assembly and the surface of a workpiece M, the plasma P1 generated in the discharge space 15a can be easily transferred to a space between the workpiece M and the first electrode assembly to thereby generate plasma P2 for a stable surface-treatment. In particular, since a capacitor C1 electrically connected to a side end of the conductor of the first electrode assembly is grounded, the non-uniform voltage distribution along the longitudinal direction of the first electrode assembly is prevented to thereby generate the stabilized plasma P1 and P2. The capacitor C1 allows the voltage to be uniformly distributed over the first electrode assembly through the charging and discharging operation. Since a high-frequency power is applied, the capacitor can be charged and discharged even though it is not grounded. However, it is preferable that the capacitor is grounded. In addition, the reaction gas supplied through the inlet 11 has a first uniform pressure distribution along the longitudinal direction of the buffer space 12 which is formed in the longitudinal direction of the first electrode assembly 30. The reaction gas supplied from the buffer space 12 at a uniform pressure through the orifices 13 collides against an inner wall of the mixing space 13a and then mixed in the mixing space to have a secondary uniform pressure distribution along the longitudinal direction of the first electrode assembly 30. The reaction gas in the mixing space 13a having the uniform pressure distribution is supplied into the discharge space 15a such that the stable plasma P1 and P2 can be generated along the longitudinal direction of the first electrode assembly 30.

In the plasma generator of this embodiment, plasma is generated in a discharge space and then transferred onto the workpiece surface such that polyfluorocarbon or hydrocarbon can be coated onto the workpiece surface. However, a workpiece may be carried directly to the discharge space, where plasma is generated, to perform the surface treatment.

The workpiece may be one of a metallic material, glass, silicon wafer, oxide, nitride, ceramic, polymer, rubber, silicone and fiber or a composite material thereof, excluding liquids and gases.

Hereafter, examples of the present invention will be described in detail.

Example 1

| | |
|---|---|
| Purpose: Super-hydrophobicity | Inert gas: He (10 liter/min) |
| Frequency: 13.56 MHz | Reaction gas: $CF_4$ (15 sccm), |
| Power: 250 W | $H_2$ (5 sccm) |
| Workpiece: Copper sheet | Number of times of treatment: 15 times |
| Contact angle after processing: 171° | Processing rate: 10 mm/sec |

Example 2

| | |
|---|---|
| Purpose: Super-hydrophobicity | Inert gas: He (10 liter/min) |
| Frequency: 13.56 MHz | Reaction gas: $CF_4$ (15 sccm), |
| Power: 250 W | $CH_4$ (5 sccm) |
| Workpiece: Aluminum sheet | Number of times of treatment: 15 times |
| Contact angle after processing: 168° | Processing rate: 10 mm/sec |

Example 3

| | |
|---|---|
| Purpose: Super-hydrophobicity | Inert gas: He (10 liter/min), |
| Frequency: 13.56 MHz | Ar (1 liter/min) |
| Power: 250 W | Reaction gas: $CF_4$ (10 sccm), |
| Workpiece: Glass | $H_2$ (5 sccm) |
| Contact angle after processing: 157° | Number of times of treatment: 10 times |
| | Processing rate: 10 mm/sec |

Example 4

| | |
|---|---|
| Purpose: Super-hydrophobicity | Inert gas: He (10 liter/min) |
| Frequency: 13.56 MHz | Reaction gas: $CF_4$ (10 sccm), |
| Power: 250 W | $H_2$ (5 sccm) |
| Workpiece: Polyimide film | Number of times of treatment: 20 times |
| Contact angle after processing: 175° | Processing rate: 10 mm/sec |

Example 5

| | |
|---|---|
| Purpose: Hydrophobicity | Inert gas: He (10 liter/min) |
| Frequency: 13.56 MHz | Reaction gas: $CH_4$ (10 sccm) |
| Power: 200 W | Number of times of treatment: 10 times |
| Workpiece: Copper sheet | Processing rate: 10 mm/sec |
| Contact angle after processing: 112° | |

Example 6

| | |
|---|---|
| Purpose: Hydrophobicity | Inert gas: He (10 liter/min) |
| Frequency: 13.56 MHz | Reaction gas: $CH_4$ (10 sccm) |
| Power: 200 W | Number of times of treatment: 10 times |
| Workpiece: Glass | Processing rate: 10 mm/sec |
| Contact angle after processing: 115° | |

In the examples 1 to 6, helium was used as inert gas in order to treat the surface of a workpiece to be hydrophobic or super-hydrophobic. Metals, polymer-based films and glass were used as the workpiece. However, since the treatment is carried out under the atmospheric pressure, the out-gassing which may causes problems in a vacuum process needs not be considered. Thus, all kinds of materials including the workpiece materials described in the above examples can be used as the workpiece.

In addition, since the plasma has a sheath area, the present invention can be applied to the surface treatment of a variety of workpieces such as a flat plate, a needle, a bulk type, a surface, a particle and the like.

Figure 5:
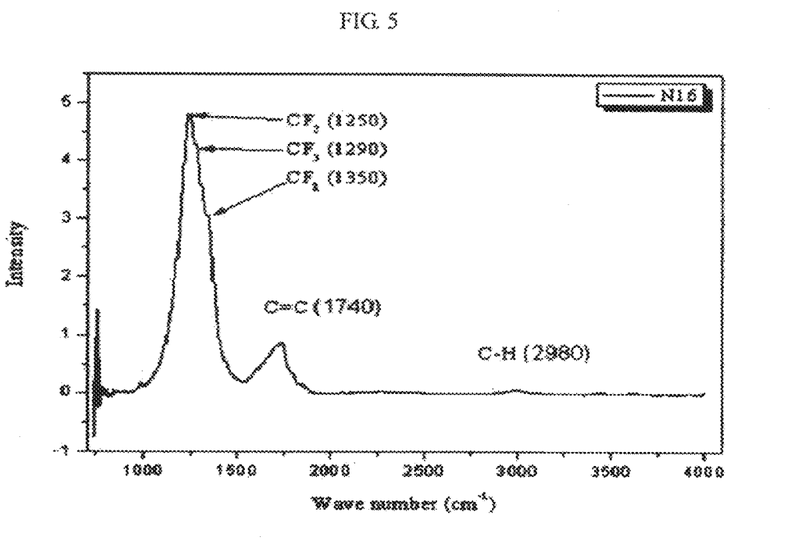
FIG. 5 shows FTIR analysis data for workpieces treated according to the present invention.

FIG. 5 shows FTIR data for workpieces according to the present invention. Peaks located at specific wavelength bands represent bonding type and energy among relevant elements. As a result of analysis, it has been found that $CF_2$-, $CF_3$- and CF-based polyfluorocarbon is coated onto the workpiece.

Figure 6:
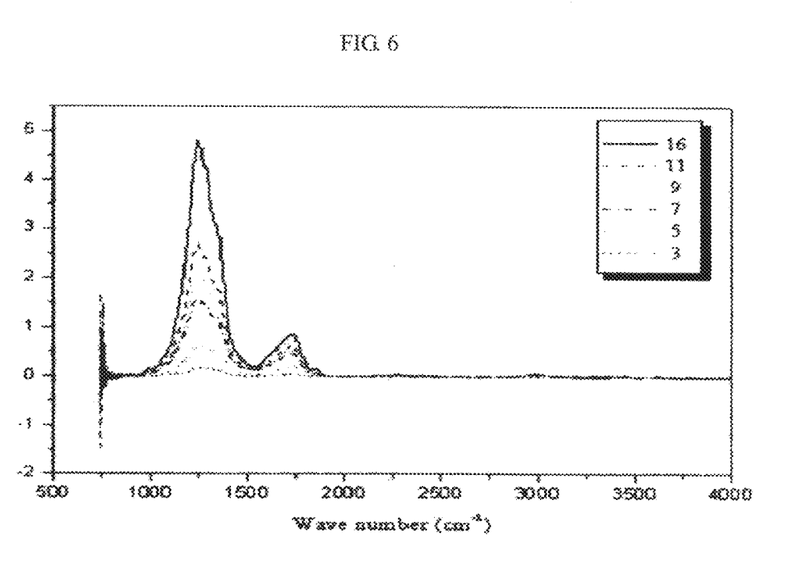
FIG. 6 shows FTIR analysis data for workpieces classified by the number of times of treatment according to the present invention.

FIG. 6 shows FTIR data for workpiece classified by the numbers of times of treatment according to the invention. It can be seen from this figure that signal intensity of C-F based and C-C based elements increases as the number of times of treatment increases.

Figure 7:
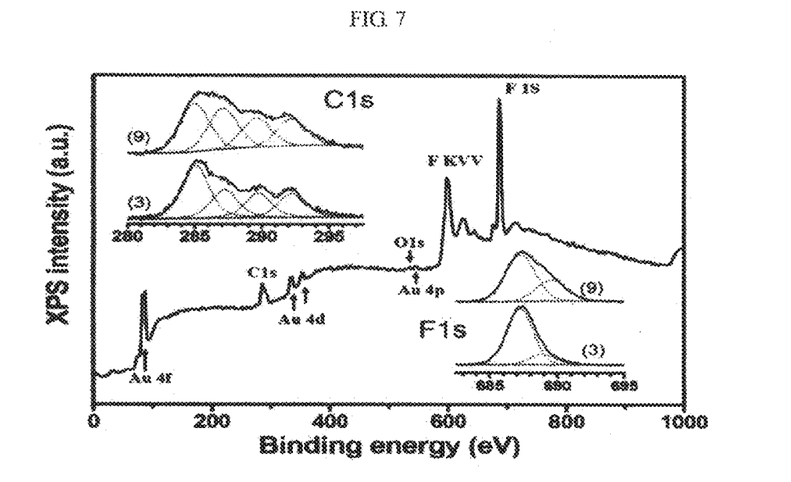
FIG. 7 is an XPS spectrum of a super-hydrophobic coating deposited on a gold film.

FIG. 7 shows an XPS spectrum for a super-hydrophobic coating deposited on a gold film. The measured spectrum corresponds to a coating when it is processed three times. The high-resolution spectra for C1s and F1s correspond respectively to coatings when they are processed three and nine times. As the result of analyzing the high-resolution spectrum into a spectrum with a plurality of peaks, it can be seen that carbon- and fluoro-based elements with a variety of bonding energy have been detected. The inserted numerals denote the number of times of treatment. The C1s and F1s spectra are compensated by a desired amount in order to place C-C at 285.0 eV.

Figure 8:
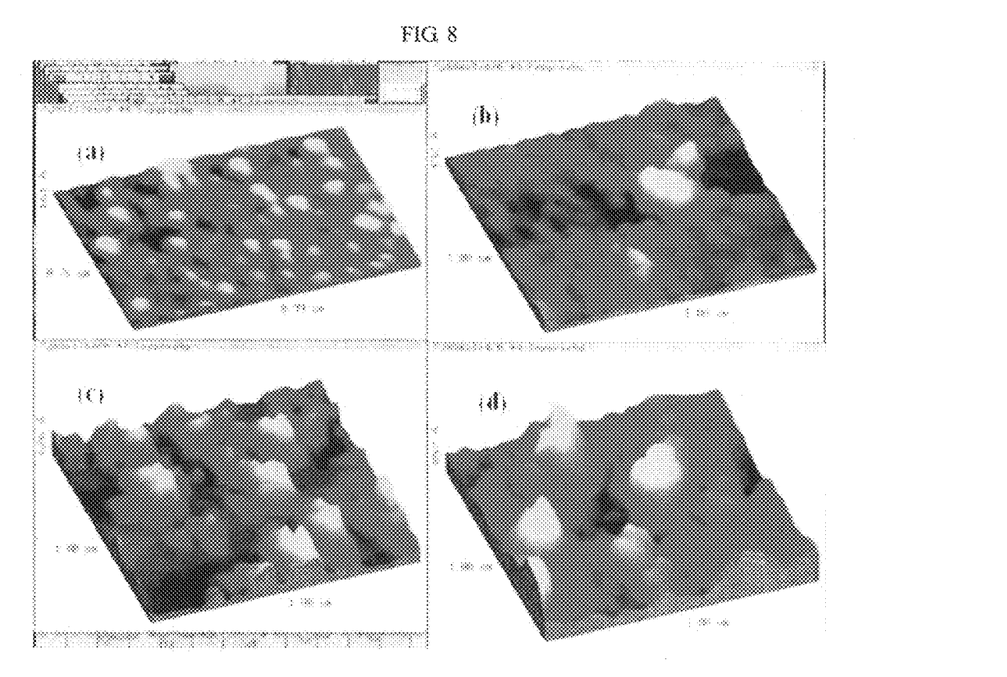
FIG. 8 shows an AFM image of a gold film treated with $CF_4$-$H_2$—He gas.

FIG. 8 shows an AFM image of a gold film treated using $CF^4$—$H_2$—He gas according to the number of times of treatment, in which (a) corresponds to an image of the non-treated gold film while (b), (c) and (d) correspond to images of the gold film which is treated three times, seven times and eleven times, respectively. The sizes of the controls for respective images are (a) 14.4 nm, (b) 44.6 nm, (c) 64.0 nm and (d) 79.6 nm.

It can be seen from this figure that the surface roughness increases as the number of times of treatment increases. Further, after the eleven times of treatment have been made, the sub-nano surface roughness can be obtained. Considering that the super-hydrophobicity of a workpiece treated in a vacuum process can be obtained when its surface roughness is an order of micrometer, it can be seen that the surface of workpiece according to the present invention exhibits the super-hydrophobicity even when it has very low surface roughness.

It has been confirmed that about 45□ of polyfluorocarbon is coated per each treatment in a case where an average processing rate is 10 mm/sec.

Figure 9:
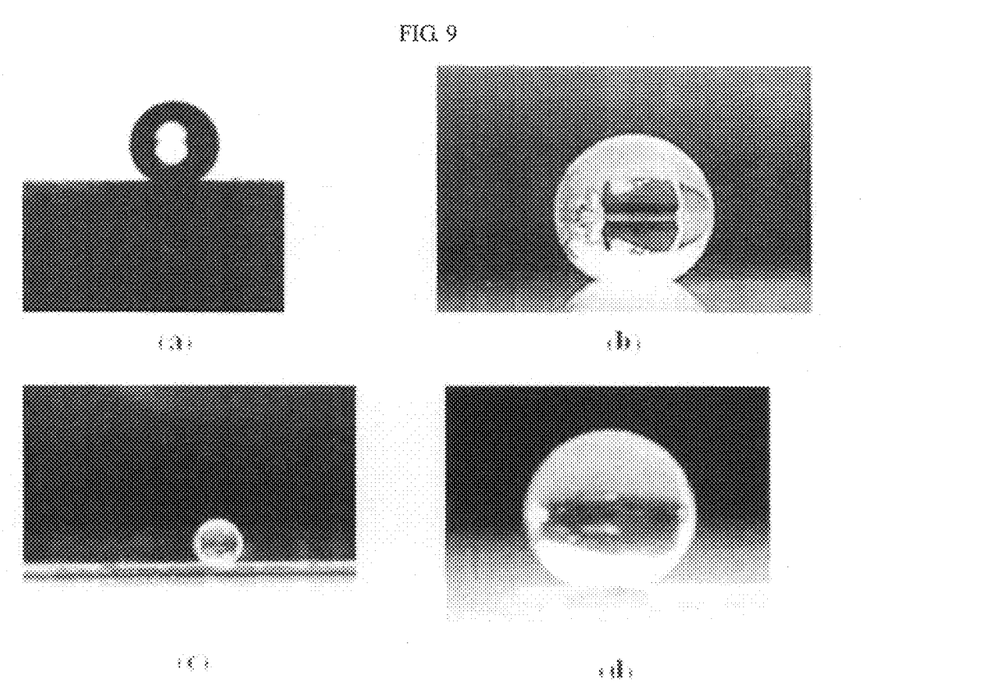
FIG. 9 shows a contact angle image of a workpiece treated to be super-hydrophobic according to an embodiment of the present invention.

FIG. 9 shows contact angles for workpieces made of (a) copper, (b) silicon wafer, (c) aluminum and (d) slide glass, which are treated to be hydrophobic according to an embodiment of the present invention. The processing rate and the number of times of treatment are 10 mm/sec and 10 times, respectively.

Figure 10:
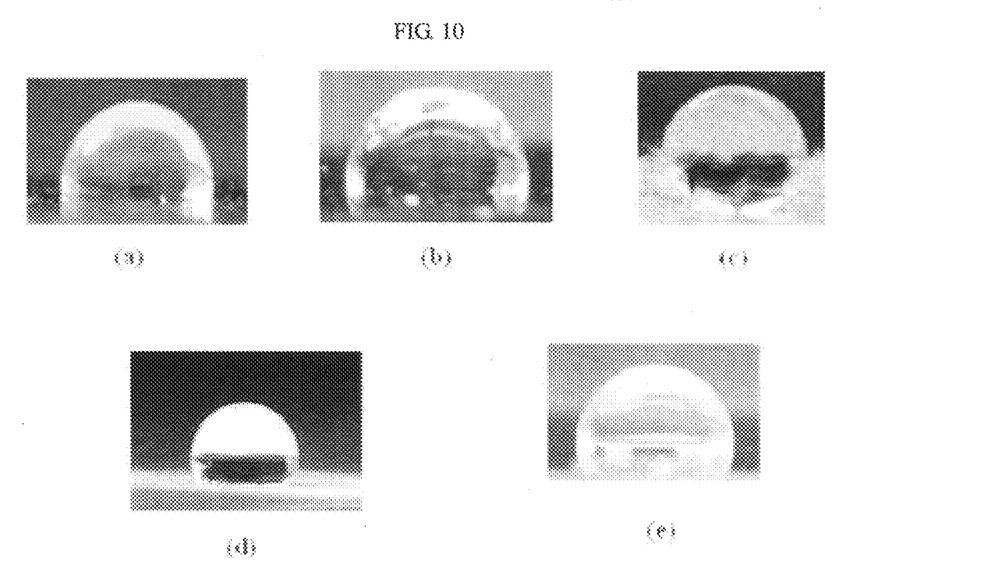
FIG. 10 shows a contact angle image of a workpiece treated to be hydrophobic according to an embodiment of the present invention.

FIG. 10 shows contact angles for workpieces made of (a) copper, (b) silicon wafer, (c) cotton, (d) paper and (e) slide glass, which are treated to be hydrophobic according to an embodiment of the present invention. The processing rate and the number of times of treatment are 10 mm/sec and 10 times, respectively.

Figure 11:
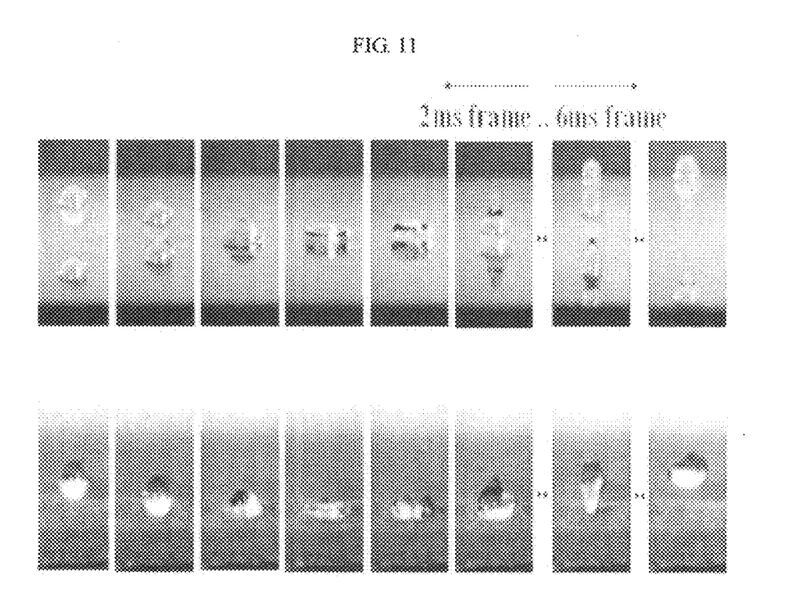
FIG. 11 shows an image of water dropping onto a film treated to be super-hydrophobic according to an embodiment of the present invention.

FIG. 11 shows continuous images in which water drops fall onto a gold film (in upper frames) and a cotton fabric (in lower frames), which are coated to be super-hydrophobic according to an embodiment of the present invention. The first six images were taken at a time interval of 2 ms and the remaining two images were taken at a time interval of 6 ms. The water drops fallen onto the super-hydrophobic workpiece do not adhere to but bounces up from the workpiece.

Figure 12:
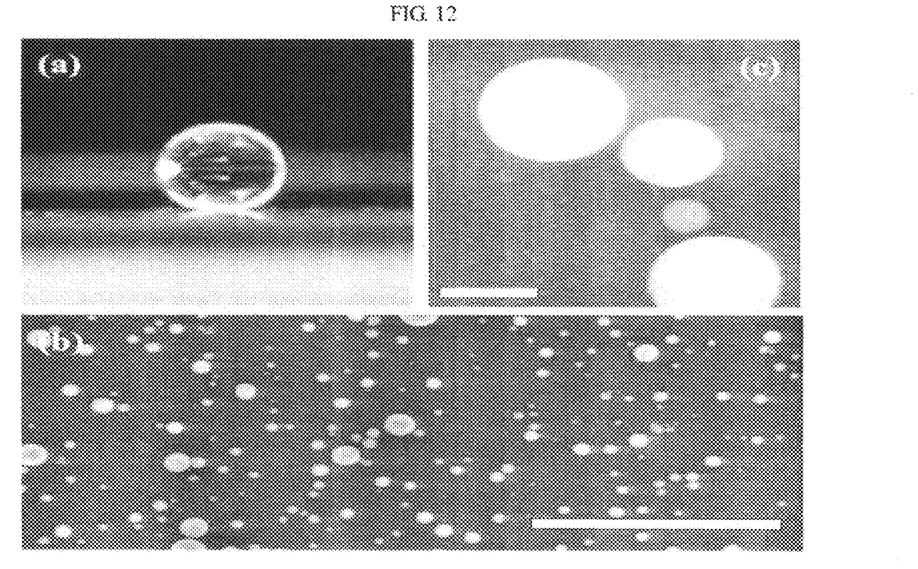
FIG. 12 shows an image and E-SEM image of water dropping onto a film treated to be super-hydrophobic according to an embodiment of the present invention.

FIG. 12 (a) is a photograph showing a water drop on a gold film that is treated to be super-hydrophobic according to an embodiment of the invention, and FIGS. 12 (b) and (c) are E-SEM images showing a water drop condensed on the super-hydrophobic coating film deposited on the gold film. The vapor pressure is 5.54 Torr, the temperature of the workpiece is 3.0° C., and the scale bars in FIGS. 12 (b) and (c) are 100 mm and 5 mm, respectively.

INDUSTRIAL APPLICABILITY

According to the present invention, the surface of a workpiece is treated to be hydrophobic or super-hydrophobic using atmospheric pressure glow discharge plasma. The workpiece surface can be easily modified by adjusting the processing rate and the number of times of treatment.

In addition, according to the type of a workpiece, a variety of transport systems such as a scan type, a roll-to-roll type and a reel-to-reel type can be selected to control the polyfluorocarbon deposition rate. Since a large area workpiece can be treated by using a continuous process, there is no limitation on the size of workpiece to be treated.

Furthermore, the treatment with the atmospheric plasma in an open space has a higher processing rate as compared with the treatment with vacuum plasma. Thus, the time and costs can be reduced and the yield of products can also be improved.

Although the present invention have been described in connection with the preferred embodiments and illustrated in the accompanying drawings, it is not limited thereto but defined by the appended claims. Accordingly, it will be readily understood by those skilled in the art that various modifications and changes can be made thereto without departing from the spirit and scope of the present invention defined by the appended claims.

The invention claimed is:

1. A method of coating a surface of a workpiece with fluorocarbon, comprising:
generating first atmospheric pressure glow plasma by supplying a reaction gas into a discharge space formed between a first electrode and a second electrode, the reaction gas containing hydrocarbon gas, fluorocarbon gas, and inert gas, the first and second electrodes being connected to an RF power supply of an atmospheric pressure plasma generator; and
approaching the workpiece to the first electrode at a downstream side of a flow of the reaction gas passing through the discharge space and placing the workpiece outside the discharge space formed between the first and second electrodes, such that the first atmospheric pressure glow plasma generated in the discharge space is transferred into a space, which is between the first electrode and the workpiece and other than the discharge space, to generate a second atmospheric pressure glow plasma therein, whereby a fluorocarbon coating layer is formed on the surface of the workpiece and a contact angle of the coating layer with water is no less than 150 degrees;
wherein a volume ratio fluorocarbon/hydrocarbon of the fluorocarbon gas and hydrocarbon gas contained in the reaction gas is within a range of 0.1 to 10.

2. The method as claimed in claim 1, wherein the hydrocarbon gas is selected from the group consisting of $C_2H_2$, $CH_4$, $C_2H_4$, $C_2H_6$, $C_3H_8$, and a mixture of at least two thereof.

3. The method as claimed in claim 2, wherein the fluorocarbon gas is selected from the group consisting of $CF_3$, $CF_4$, $C_2F_6$, $C_4F_8$, and a mixture thereof.

4. The method as claimed in claim 1, wherein a volume of the inert gas contained in the reaction gas is at least 90% of a total volume of the reaction gas.

5. The method as claimed in claim 1, wherein
the first electrode has a shape of a rod with a predetermined length,
the second electrode is spaced apart from the first electrode by a predetermined distance along a longitudinal direction of the first electrode to thereby form the discharge space,
the atmospheric pressure plasma generator further includes a gas supply unit formed with a passage through which the reaction gas is supplied to the discharge space, and
the passage includes a buffer space formed along the longitudinal direction of the first electrode, a mixing space formed along the longitudinal direction of the first electrode and having one side opened toward the discharge space, and an orifice formed from the buffer space toward an inner wall of the mixing space to connect the buffer space to the mixing space.

* * * * *